United States Patent
Hayashi et al.

(10) Patent No.: US 11,451,161 B2
(45) Date of Patent: Sep. 20, 2022

(54) POWER SWITCHER, POWER RECTIFIER, AND POWER CONVERTER INCLUDING CASCODE-CONNECTED TRANSISTORS

(71) Applicant: KABUSHIKI KAISHA TOSHIBA, Tokyo (JP)

(72) Inventors: Yusuke Hayashi, Kanagawa (JP); Kazuto Takao, Ibaraki (JP); Kentaro Ikeda, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 7 days.

(21) Appl. No.: 17/013,981

(22) Filed: Sep. 8, 2020

(65) Prior Publication Data

US 2021/0126549 A1 Apr. 29, 2021

(30) Foreign Application Priority Data

Oct. 25, 2019 (JP) .............................. JP2019-194441

(51) Int. Cl.
*H02M 3/158* (2006.01)
*H02M 1/00* (2006.01)
(Continued)

(52) U.S. Cl.
CPC ............. *H02M 7/219* (2013.01); *H02M 1/08* (2013.01); *H02M 3/158* (2013.01); *H03K 17/6871* (2013.01); *H02M 1/0003* (2021.05); *H02M 1/007* (2021.05); *H02M 1/0074* (2021.05); *H02M 1/088* (2013.01)

(58) Field of Classification Search
CPC .... H02M 7/217; H02M 7/219; H02M 7/2195; H02M 3/285; H02M 3/33576; H02M 3/3353; H02M 1/088; H02M 1/0074
See application file for complete search history.

(56) References Cited

U.S. PATENT DOCUMENTS 8,866,253 B2 * 10/2014 Weis ..................... H03K 17/063
257/E27.033
8,958,189 B1 * 2/2015 Weyers .............. H03K 17/6871
361/91.1
(Continued)

FOREIGN PATENT DOCUMENTS

CN 104867465 A * 8/2015 ........... A61B 5/4538
CN 110352550 A * 10/2019 ............. F03D 9/255
(Continued)

*Primary Examiner* — Sisay G Tiku
(74) *Attorney, Agent, or Firm* — Finnegan, Henderson, Farabow, Garrett & Dunner L.L.P.

(57) ABSTRACT

A power switcher includes a first normally-off transistor that switches between interrupting and not interrupting a current path between first and second electrodes according to a drive voltage input to a first control electrode, a second normally-on transistor cascode-connected to the first transistor and including a second control electrode to which the second electrode of the first transistor is connected, a control voltage generator that generates a control voltage in accordance with a voltage between the first and second electrodes of the first transistor, and a drive voltage generator that generates a drive voltage equal to or lower than a withstand voltage of the first transistor in accordance with the control voltage.

20 Claims, 8 Drawing Sheets

(51) Int. Cl.
*H02M 3/335* (2006.01)
*H02M 3/28* (2006.01)
*H02M 7/219* (2006.01)
*H02M 7/217* (2006.01)
*H02M 1/08* (2006.01)
*H03K 17/687* (2006.01)
*H02M 1/088* (2006.01)

(56) References Cited

U.S. PATENT DOCUMENTS

| | | | |
|---|---|---|---|
| 9,007,117 B2 * | 4/2015 | Weis | H03K 17/687 |
| | | | 327/434 |
| 9,374,016 B2 | 6/2016 | Yamada | |
| 9,679,880 B2 | 6/2017 | Ikeda | |
| 9,966,871 B2 | 5/2018 | Ishimaru et al. | |
| 2007/0086222 A1 * | 4/2007 | Iida | H02J 7/022 |
| | | | 363/37 |
| 2011/0090725 A1 | 4/2011 | Lu | |
| 2011/0199148 A1 * | 8/2011 | Iwamura | H03K 17/567 |
| | | | 327/430 |
| 2011/0310637 A1 * | 12/2011 | Takegami | H02M 3/33584 |
| | | | 363/16 |
| 2012/0175635 A1 * | 7/2012 | Weis | H03K 17/06 |
| | | | 257/272 |
| 2012/0262220 A1 | 10/2012 | Springett | |
| 2014/0016361 A1 | 1/2014 | Weis et al. | |
| 2015/0200605 A1 * | 7/2015 | Weis | H03K 17/102 |
| | | | 363/127 |
| 2016/0005725 A1 | 1/2016 | Ikeda | |
| 2018/0287506 A1 * | 10/2018 | Gadler | H02M 7/06 |
| 2020/0006970 A1 * | 1/2020 | Chen | H02M 7/217 |

FOREIGN PATENT DOCUMENTS

| | | | | |
|---|---|---|---|---|
| CN | 110677060 A | * | 1/2020 | H02J 9/061 |
| CN | 112994410 A | * | 6/2021 | |
| DE | 102013213447 A1 | * | 1/2014 | H01L 27/0886 |
| DE | 102013213453 A1 | * | 1/2014 | H02M 7/217 |
| DE | 102018107601 A1 | * | 10/2018 | H02M 1/08 |
| DE | 202019001889 U1 | * | 10/2019 | H02M 1/08 |
| DE | 112020001370 T5 | * | 12/2021 | H02M 3/158 |
| EP | 2703208 A1 | * | 3/2014 | B60L 15/2045 |
| EP | 2995495 A1 | * | 3/2016 | B60L 9/24 |
| EP | 2 995 495 A1 | | 3/2018 | |
| EP | 3251206 B1 | * | 10/2020 | B60L 9/24 |
| EP | 3813243 A1 | * | 4/2021 | H02M 1/08 |
| JP | 2012-205356 A | | 10/2012 | |
| JP | 2013-509152 A | | 3/2013 | |
| JP | 2013-198388 A | | 9/2013 | |
| JP | 2014-512765 A | | 5/2014 | |
| JP | 2015-116077 A | | 6/2015 | |
| JP | 2016-19112 A | | 2/2016 | |
| JP | 2016-27779 A | | 2/2016 | |
| JP | 2016-46935 A | | 4/2016 | |
| JP | 2017-77114 A | | 4/2017 | |
| WO | WO-2012093177 A2 | * | 7/2012 | H01L 21/823418 |
| WO | WO-2016120335 A1 | * | 8/2016 | B60L 9/24 |
| WO | WO-2016169597 A1 | * | 10/2016 | H02J 3/1842 |
| WO | WO-2017089726 A2 | * | 6/2017 | H02M 3/158 |

* cited by examiner

POWER SWITCHER, POWER RECTIFIER, AND POWER CONVERTER INCLUDING CASCODE-CONNECTED TRANSISTORS

CROSS REFERENCE TO RELATED APPLICATIONS

This application is based upon and claims the benefit of priority from the prior Japanese Patent Application No. 2019-194441, filed on Oct. 25, 2019, the entire contents of which are incorporated herein by reference.

FIELD

Embodiments of the present invention relate to a power switcher, a power rectifier, and a power converter.

BACKGROUND

There has been proposed a power converter that performs power conversion by applying an input voltage to a multi-cell circuit in which a plurality of cell circuits such as AC-DC converters and DC-DC converters is connected in series. In this type of power converter, it is common to provide a slave controller that controls the output voltage and output electric current of a cell circuit for each cell circuit, and a master controller that stabilizes the operation of all the cell circuits in the multi-cell circuit. The master controller needs to control each cell circuit in cooperation with each slave controller, thus making the control more complicated. Further, if a master controller is provided, the number of components increases and wiring is required to connect the master controller to all the cell circuits. This increases the number of wires, increases power consumption, and makes it difficult to reduce the size of the device.

In addition, the above-described cell circuit often includes a full-wave rectifier circuit, but when a diode is used in the full-wave rectifier circuit, power loss of the diode becomes a problem. Therefore, there has been proposed a synchronous rectifying circuit that suppresses power loss by connecting a transistor to a diode in parallel and passing the electric current through the transistor rather than through the diode.

However, in order to perform high voltage rectification using the synchronous rectifying circuit, it is necessary to provide a transistor having a high withstand voltage, which increases cost and requires a complicated control circuit for suppressing power loss of the transistor.

DETAILED DESCRIPTION

According to one embodiment, a power switcher includes a first normally-off transistor that switches between interrupting and not interrupting a current path between first and second electrodes according to a drive voltage input to a first control electrode, a second normally-on transistor cascode-connected to the first transistor and including a second control electrode to which the second electrode of the first transistor is connected, a control voltage generator that generates a control voltage in accordance with a voltage between the first and second electrodes of the first transistor, and a drive voltage generator that generates a drive voltage equal to or lower than a withstand voltage of the first transistor in accordance with the control voltage.

Embodiments of a power switcher, a power rectifier, and a power converter will be described below with reference to the accompanying drawings. In the following, the main constituent components of the power switcher, the power rectifier, and the power converter will be mainly described, but the power switcher, the power rectifier, and the power converter may include other constituent components or functions not illustrated or described.

First Embodiment

Figure 1:
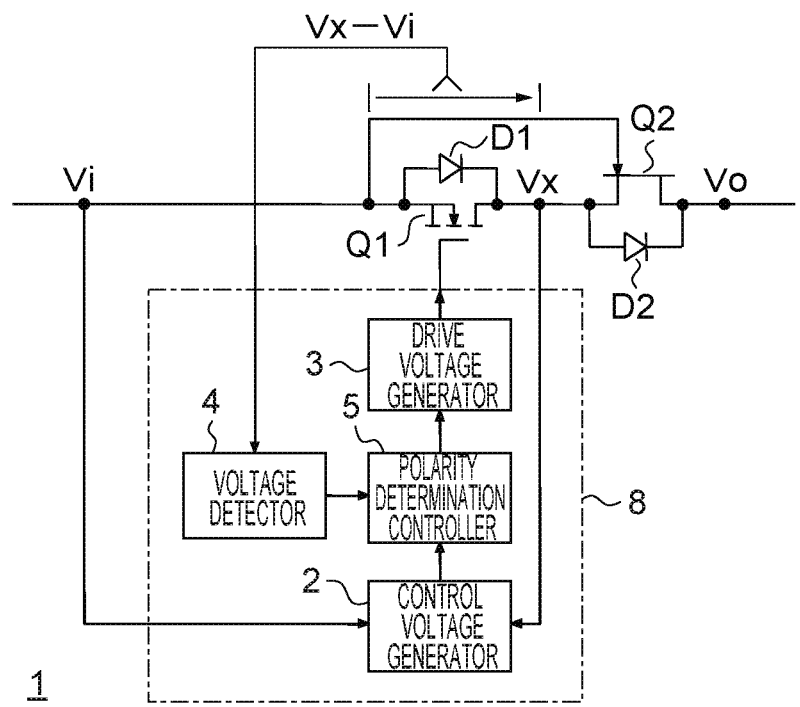
FIG. 1 is a circuit diagram of a power switcher according to a first embodiment.

FIG. 1 is a circuit diagram of the power switcher 1 according to a first embodiment. The power switcher 1 of FIG. 1 includes a first normally-off transistor Q1, a normally-off second transistor Q2, a control voltage generator 2, and a drive voltage generator 3.

The first transistor Q1 switches between interrupting and not interrupting the current path between first and second electrodes according to the drive voltage input to the first control electrode. In the following, an example including the first control electrode as a gate, the first electrode as a drain, and the second electrode as a source is described.

The first normally-off transistor Q1 can be a normally-off transistor, such as a silicon power metal-oxide-semiconductor field effect transistor (MOSFET) or a silicon carbide bipolar junction transistor (BJT). The first transistor Q1 may contain a diode D1 connected between the source and drain of the first transistor Q1 due to its device structure. This diode D1 may be external. The anode of the diode D1 is connected to the source of the first transistor Q1, and the cathode is connected to the drain of the first transistor Q1.

Normally-off means that no electric current passes between the drain and source of the first transistor Q1 when the gate voltage of the first transistor Q1 is set to, for example, 0 V and an off-command is given to the first transistor Q1. Therefore, the first transistor Q1 does not consume power when the gate voltage is 0 V.

The second normally-on transistor Q2 is cascode-connected to the first transistor Q1. The second transistor Q2 includes a second control electrode (e.g., gate) to which the second electrode (e.g., source) of the first transistor Q1 is connected. The second transistor Q2 may include a diode D2 connected between the source and drain of the second transistor Q2 due to its device structure. The diode D2 may be connected to the outside between the drain and the source of the second transistor Q2.

Normally-on means that the drain current Id passes through the second transistor Q2 when 0 V is applied as the gate voltage, and the electric current stops when a negative voltage (e.g., −15 V) is applied as the gate voltage. The second transistor Q2 may be any normally-on transistor, such as a junction field effect transistor (SiC-JFET). By connecting the second transistor Q2 to the first transistor Q1 by cascode-connection, it is possible to stop the electric current passing through the drain-source of the second transistor Q2 when the first transistor Q1 is off.

In the power switcher 1 of FIG. 1, the second transistor Q2 has a higher withstand voltage than that of the first transistor Q1. For example, when a large voltage is applied between the drain of the second transistor Q2 and the source of the first transistor Q1, a voltage equal to or lower than the withstand voltage of the first transistor Q1 is applied to the drain-source of the first transistor Q1, and the remaining voltage is applied to the drain-source of the second transistor Q2. Thus, even when the first transistor Q1 has a low withstand voltage, the withstand voltage of the power switcher 1 can be increased and a high voltage exceeding 100 V can be switched.

More specifically, the withstand voltage of the first transistor Q1 is, for example, about 20 V, but the withstand voltage of the second transistor Q2 is, for example, about several hundred of V. The withstand voltage of the first transistor Q1 is, for example, between 10 V and 100 V, but the withstand voltage of the second transistor Q2 is, for example, higher than 100 V and equal to or lower than 900 V. When the power switcher 1 of FIG. 1 is used to switch a high input voltage of several hundred of volts, most of the high input voltage is applied between the drain and source of the second transistor Q2, and high voltage switching can be performed without destroying the first transistor Q1.

The control voltage generator 2 generates a control voltage in accordance with the voltage between the first electrode (e.g., the drain) and the second electrode (e.g., the source) of the first transistor Q1. The power switcher 1 of FIG. 1 enables the electric current to pass between the drain and source of the first transistor Q1 rather than the diode D1 when the first transistor Q1 is on. Therefore, the control voltage generator 2 monitors the drain-source voltage of the first transistor Q1 and generates a control voltage for controlling the gate of the first transistor Q1.

Thus, the control voltage generator 2 sets the gate drive voltage of the first transistor Q1 and the second transistor Q2 so that, when the first transistor Q1 is turned on, the electric current passes from the source to the drain through the first transistor Q1 and from the source to the drain through the second transistor Q2, instead of the diode D1.

The drive voltage generator 3 generates a drive voltage equal to or lower than the withstand voltage of the first transistor Q1 in accordance with the control voltage generated by the control voltage generator 2, and applies the drive voltage to the gate of the first transistor Q1.

The power switcher 1 of FIG. 1 may include a voltage detector 4 and a polarity determination controller 5. The voltage detector 4 detects the drain-source voltage of the first transistor Q1. The polarity determination controller 5 determines whether to instruct the drive voltage generator 3 to generate the drive voltage in accordance with the polarity of the voltage between the first electrode (e.g., the drain) and the second electrode (e.g., the source) of the first transistor Q1. When instructed by the polarity determination controller 5 to generate the drive voltage by the polarity determination controller 5, the drive voltage generator 3 applies the drive voltage to the gate of the first transistor Q1.

The reason for providing the polarity determination controller 5 is to turn on the first transistor Q1 only when the AC input voltage Vin input to the power switcher 1 is, for example, the positive side voltage.

The control voltage generator 2, the drive voltage generator 3, the voltage detector 4, and the polarity determination controller 5 can be built in a semiconductor IC 8.

Since the control voltage generator 2, the drive voltage generator 3, the voltage detector 4, and the polarity determination controller 5 all operate at a low voltage equal to or lower than the withstand voltage of the first transistor Q1, the power switcher 1 of FIG. 1 needs no high voltage for the switching operation, so that the circuit configuration can be simplified and the cost of parts can be suppressed. The gate voltage of the second transistor Q2, to which a high voltage may be applied, is automatically set once the source voltage of the first transistor Q1 is determined, so that there is no need to control the second transistor Q2.

If it is desired to further improve the withstand voltage of the power switcher 1 of FIG. 1, the second normally-on transistor Q2 needs to be cascode-connected with other normally-on third transistors Q3a, Q3b, and the like. Further, the third transistors Q3a, Q3b, and the like may have n (n is an integer of 2 or more) transistors that are cascode-connected. As n increases, the withstand voltage of the power switcher 1 in FIG. 1 also increases.

Figure 2:
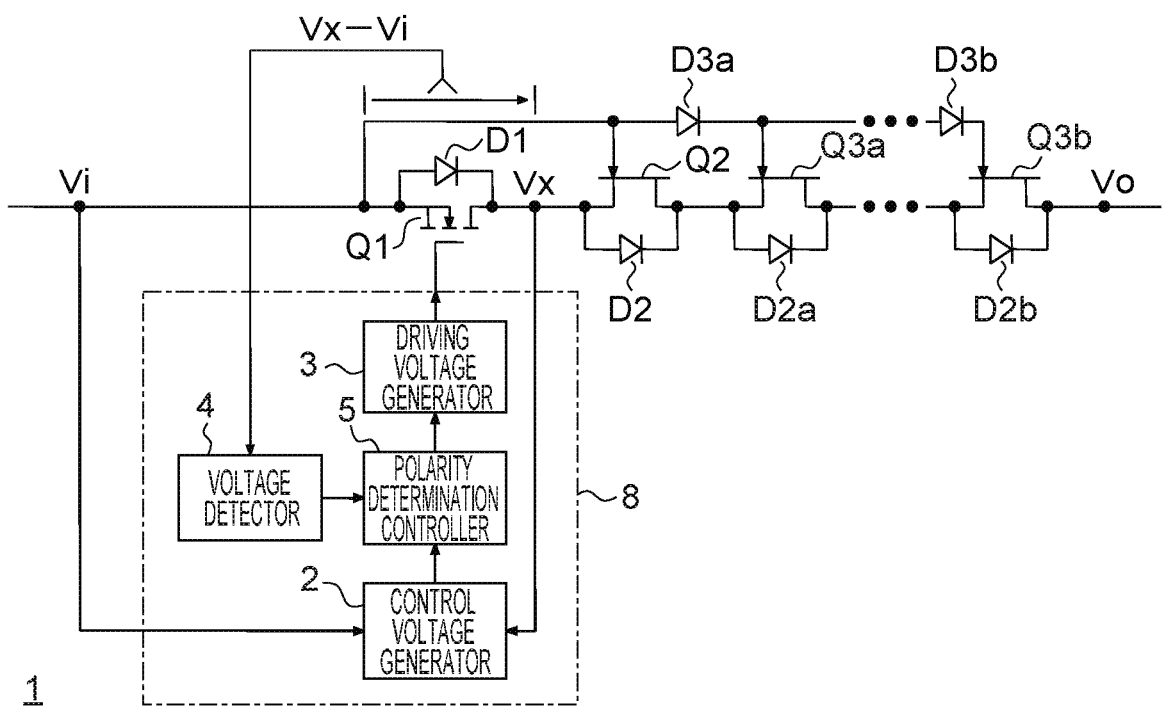
FIG. 2 is a circuit diagram of a power switcher with a third transistor cascode-connected to the second transistor.

FIG. 2 is a circuit diagram of the power switcher 1 in which the third transistors Q3a, Q3b, and the like are cascode-connected to the second transistor Q2. The power switcher 1 of FIG. 2 includes the third transistors Q3a, Q3b, and the like that are cascode-connected to the second transistor Q2, and the third transistors Q3a, Q3b, and the like include n cascode-connected transistor groups. A diode (third rectifying element) D3a is connected between the gates of the third transistors Q3a, Q3b, and the like and the source of the first transistor Q1. In addition, diodes D3b are connected in the same direction between the gates of the transistors of the third transistors Q3a, Q3b, and the like. By providing the diodes D3a and D3b to determine the source voltage of the first transistor Q1, the gate voltages of the second transistor Q2 and all of the n transistors in the third transistors Q3a, Q3b, and the like can be determined, so that there is no need to individually control the gate voltages of the second transistor Q2 and the n transistors. By adjusting the number n, the withstand voltage of the power switcher 1 in FIG. 2 can be freely controlled. That is, if it is desired to further increase the withstand voltage, the number of cascode-connected transistors only has to be increased.

As described above, the power switcher 1 according to the present embodiment is configured by cascode-connecting the normally-off first transistor Q1 having the low withstand voltage and the normally-on second transistor Q2 having the high withstand voltage, so that the switching operation of the power switcher 1 can be performed at a low voltage, and the circuit configuration can be simplified. Further, the power switcher 1 according to the present embodiment has a high withstand voltage, although the first transistor Q1 having the low withstand voltage is included. This is achieved by controlling the gate voltages of the transistors Q1 and Q2 to apply a voltage lower than the withstand voltage of the first transistor Q1 to the drain-source of the first transistor Q1, while applying a high voltage between the drain and source of the second transistor Q2. Further, the third transistors Q3a, Q3b, and the like are cascode-connected to the second transistor Q2, while adjusting the number of cascode-connected transistors of the third transistors Q3a, Q3b, and the like, so that the withstand voltage of the power switcher 1 can be adjusted freely.

Further, the second transistor Q2 is a normally-on transistor and is cascode-connected to the first transistor Q1 which is a normally-off transistor. Therefore, the electric current does not continuously pass through the power switcher 1 when the gate drive voltage is 0 V, and there is no need to continuously apply a negative gate drive voltage from the drive voltage generator 3, so that power consumption during the turned-off period can be suppressed.

Second Embodiment

A second embodiment is provided by applying the power switcher 1 of the first embodiment to a power rectifier.

Figure 3:
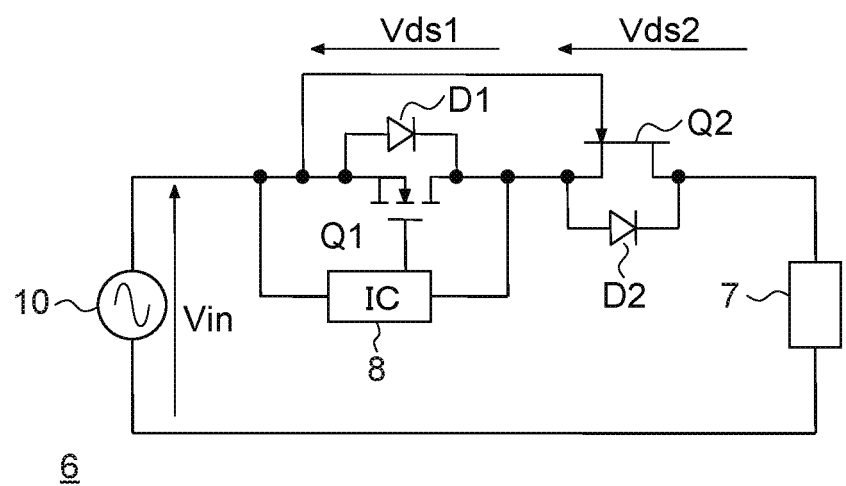
FIG. 3 is a circuit diagram of a power rectifier according to a second embodiment.

FIG. 3 is a circuit diagram of the power rectifier 6 according to the second embodiment. A power rectifier 6 in FIG. 3 rectifies the AC input voltage Vin and outputs a half-wave rectified voltage. The half-wave rectified voltage output from the power rectifier 6 is supplied to a load circuit 7. Any type of the load circuit 7 may be used. The load circuit 7 may be a power converter such as a DC-DC converter.

The power rectifier 6 can be configured with a circuit similar to the power switcher 1 of FIG. 1 or 2. FIG. 3 illustrates an example in which the control voltage generator 2, the drive voltage generator 3, the voltage detector 4, and the polarity determination controller 5 of FIG. 1 are configured by the semiconductor IC 8, but at least a part of the IC 8 may be configured with another semiconductor IC 8 or with discrete components.

The power rectifier 6 of FIG. 3 is a synchronous rectifying circuit. For example, when it is desired to pass the electric current from an AC power supply 10 to the load circuit 7, the gate voltage of the first transistor Q1 is controlled to turn on the first transistor Q1, instead of passing the electric current to the diode D1 connected in parallel with the drain-source of the first transistor Q1, so that the electric current can pass through the source-drain of the first transistor Q1. Thus, the power rectifier 6 of FIG. 3 operates as a synchronous rectifying circuit by turning on or off the first transistor Q1 to perform the rectifying action.

Figure 4:
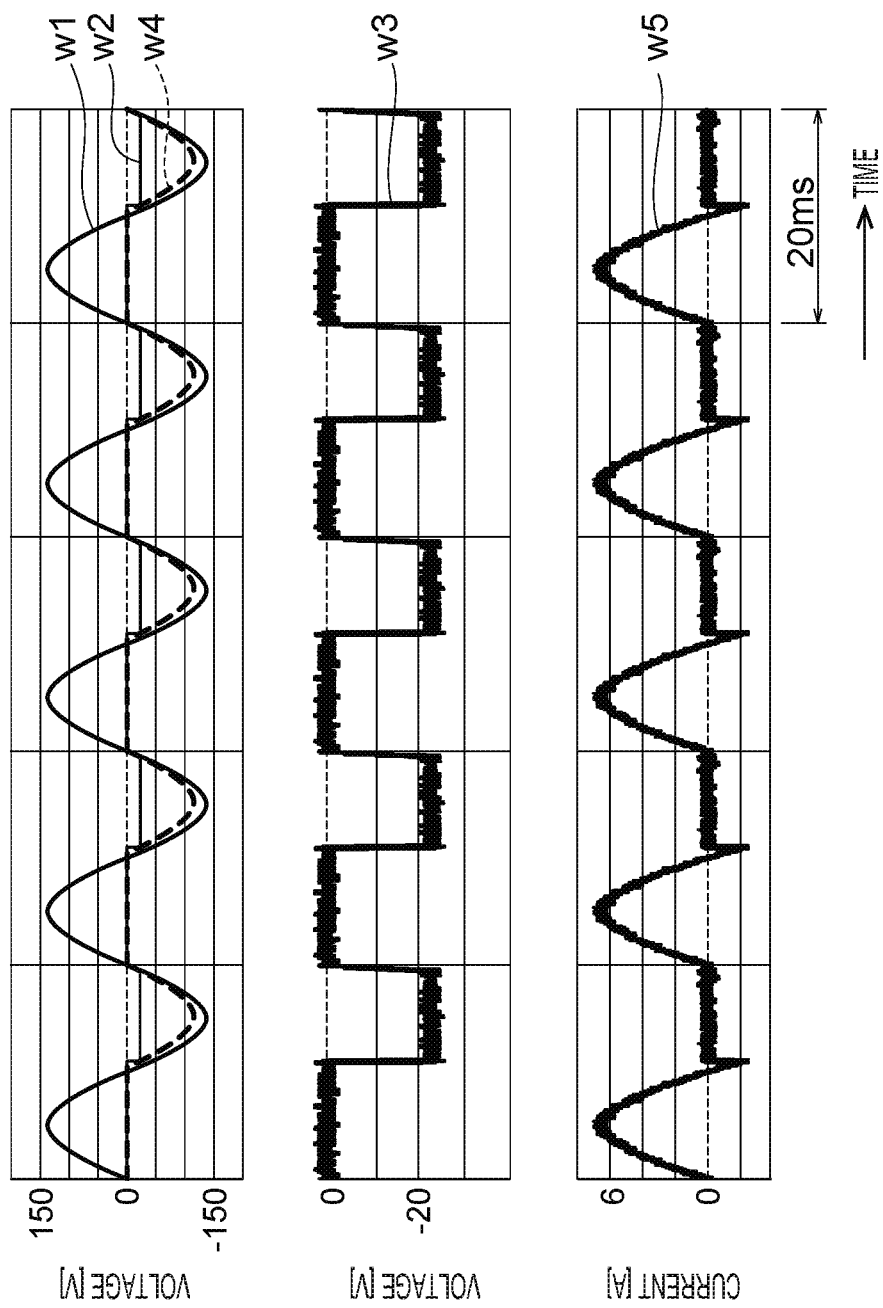
FIG. 4 is a voltage/electric current waveform diagram when the power rectifier of FIG. 3 is actually operated.

FIG. 4 is a voltage/current waveform diagram when the power rectifier 6 of FIG. 3 is actually operated. In FIG. 4, a waveform w1 is a waveform of an AC input voltage Vin, a waveform w2 is a waveform of the drain-source voltage of the first transistor Q1 (a source voltage with reference to the drain), a waveform w3 is the waveform of an enlarged view of the waveform w2, a waveform w4 is the waveform of the drain-source voltage of the second transistor Q2 (a source voltage with reference to the drain), and a waveform w5 illustrates the electric current passing from the AC power supply to the power rectifier 6.

The AC input voltage Vin illustrated by the waveform w1 is, for example, AC 100 V. A voltage of about 20 V is applied between the drain and source of the first transistor Q1 as illustrated by the waveforms w2 and w3, and the remaining voltage is applied between the drain and source of the second transistor Q2 as illustrated by the waveform w4.

Thus, in the power rectifier 6 of FIG. 3, even when the AC input voltage Vin exceeding 100 V is applied, the power rectifier 6 of FIG. 3 applies only a low voltage of about 20 V to the drain-source of the first transistor Q1, and applying the remaining large voltage to the drain-source of the second transistor Q2, so that a large AC input voltage Vin can be synchronously rectified with a simple circuit configuration without destroying the first transistor Q1 having the low withstand voltage.

Third Embodiment

The third embodiment implements a synchronous rectifying circuit that outputs a full-wave rectified voltage.

Figure 5:
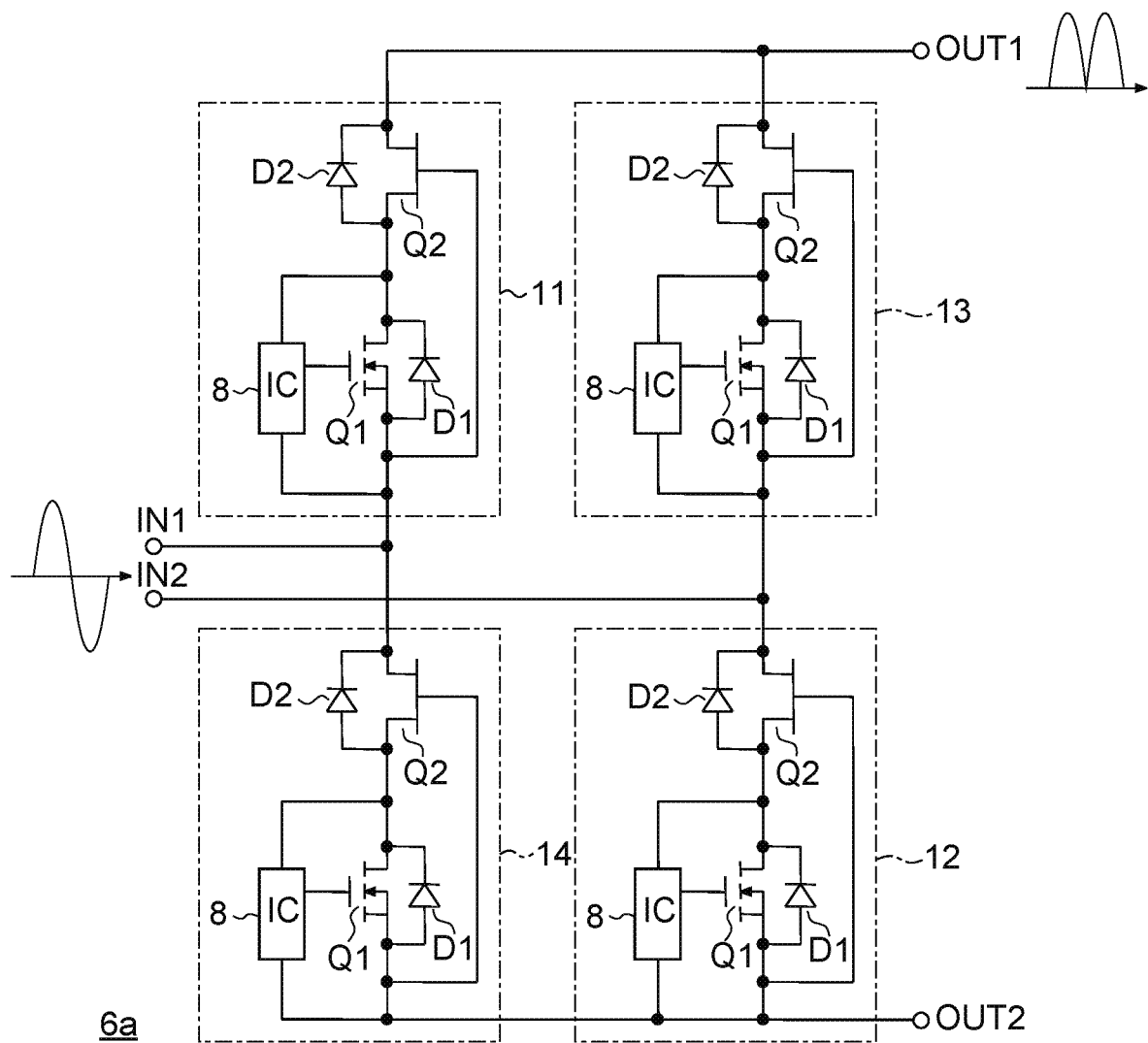
FIG. 5 is a circuit diagram of the power rectifier according to a third embodiment.

FIG. 5 is a circuit diagram of a power rectifier 6a according to the third embodiment. The power rectifier 6a of FIG. 5 is configured by bridging-connection of first to fourth power switchers 11 to 14 having the configuration similar to the configuration of the power switcher 1 of FIG. 1 or 2. A first power switcher 11 switches between passing or not passing the electric current from a first input terminal IN1 to a first output terminal OUT1. A second power switcher 12 switches between passing or not passing the electric current from a second output terminal OUT2 to a second input terminal IN2. A third power switcher 13 switches between passing or not passing the electric current from the second input terminal IN2 to the first output terminal OUT1. A fourth power switcher 14 switches between passing or not passing the electric current from the second output terminal OUT2 to the first input terminal IN1. A full-wave rectified voltage is output between the first and second output terminals OUT1 and OUT2.

The power rectifier 6a in FIG. 5 is a synchronous rectifying circuit. The first to fourth power switchers 11 to 14 individually turns on the first and second transistors Q1 and Q2 in accordance with the timing of passing the electric current in the forward direction. The first to fourth power switchers 11 to 14 perform on/off control of the first and second transistors Q1 and Q2 in accordance with the phase of the AC input voltage Vin.

For example, when the AC input voltage Vin input to the first input terminal IN1 is greater than 0 V, the first and second power switchers 11 and 12 are turned on to pass the electric current from the first input terminal IN1 to the first output terminal OUT1 through the first power switcher 11. Further, the electric current flowing into the second output terminal OUT2 passes through the second power switcher 12 to the second input terminal IN2.

On the other hand, when the AC input voltage Vin input to the first input terminal IN1 is 0 V or less, the third and fourth power switchers 13 and 14 are turned on to pass the electric current from the second input terminal IN2 to the first output terminal OUT1 through the third power switcher 13. Further, the electric current flowing into the second output terminal OUT2 passes through the fourth power switcher 14 to the first input terminal IN1.

Thus, the first to fourth power switchers 11 to 14 can constitute the synchronous rectifying circuit to control on/off of the first and second transistors Q1 and Q2 in accordance with the phase of the AC input voltage Vin. Further, each of the first to fourth power switchers 11 to 14 includes the cascode-connected first transistor Q1 having the low withstand voltage and second transistor Q2 having the high withstand voltage, so that any voltage exceeding the withstand voltage cannot be applied to the drain-source of the first transistor Q1, and the voltage exceeding the withstand voltage of the first transistor Q1 can be applied to the drain-source of the second transistor Q2, thus performing the full-wave rectification operation of a large AC input voltage Vin with low power loss.

Figure 6:
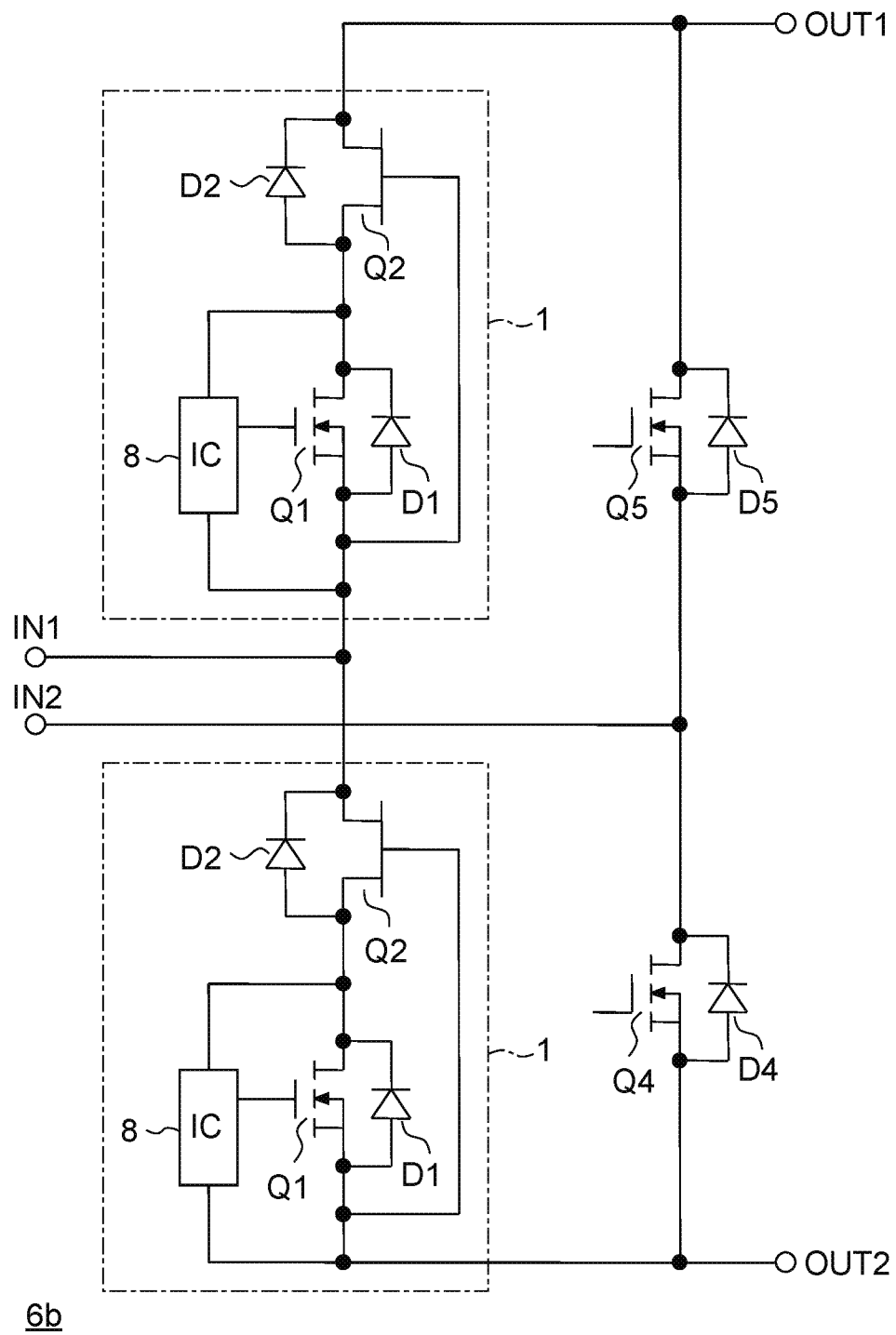
FIG. 6 is a circuit diagram of a modification of the power rectifier of FIG. 5.

As a modification of the power rectifier 6a of FIG. 5, a totem-pole type power rectifier 6b as illustrated in FIG. 6 can be provided. The power rectifier 6b of FIG. 6 is achieved by substituting the second power switcher 12 of FIG. 5 with the fourth transistor Q4 and the third power switcher 13 with the fifth transistor Q5. The power rectifier 6b of FIG. 6 is a simplified version of the power rectifier 6a of FIG. 5, and can be used for full-wave rectification of the AC input voltage Vin for only 50 Hz or 60 Hz components. The diodes D4 and D5 may be connected in parallel with the drain-source of the fifth and sixth transistors Q4 and Q5, respectively.

Fourth Embodiment

A fourth embodiment is implemented by applying the power switcher 1 described above to a power converter.

Figure 7:
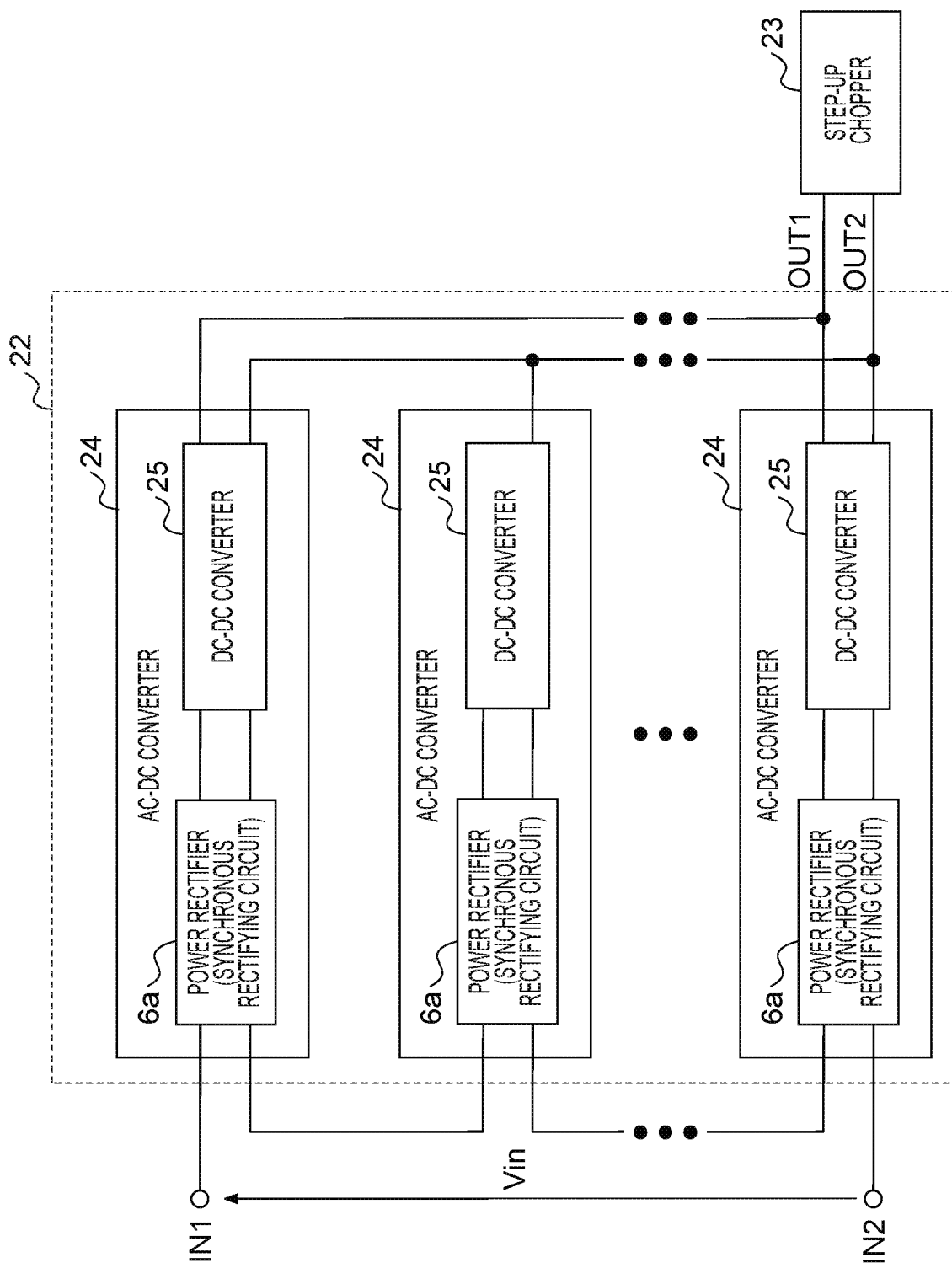
FIG. 7 is a block diagram illustrating a schematic configuration of a power converter including a power switcher 1 according to the fourth embodiment.
Figure 8:
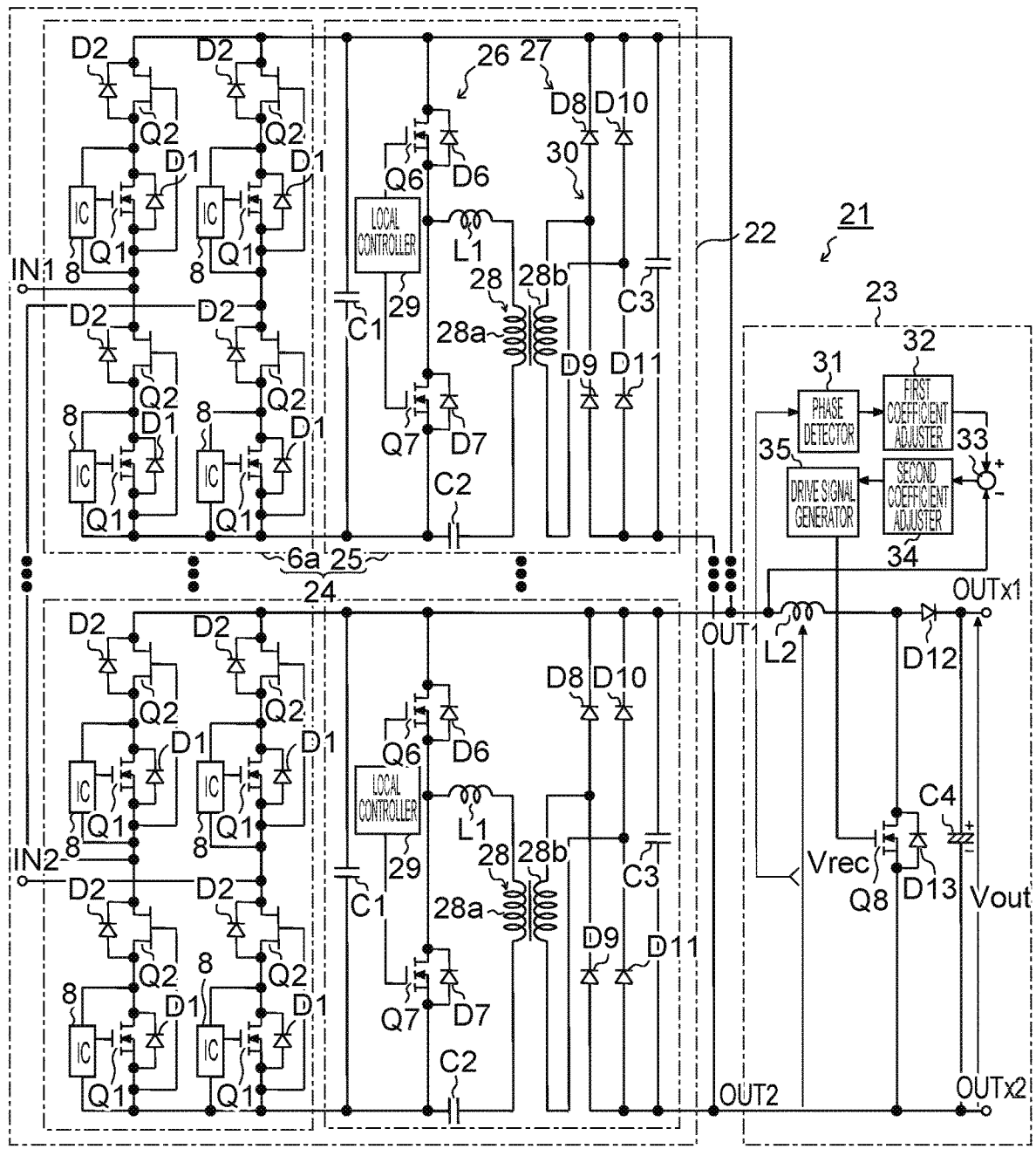
FIG. 8 is a circuit diagram illustrating an example of the power converter of FIG. 7.

FIG. 7 is a block diagram illustrating a schematic configuration of a power converter 21 including the power switcher 1 according to the fourth embodiment, and FIG. 8 is a circuit diagram illustrating an example of the power converter 21 of FIG. 7. As illustrated in FIGS. 7 and 8, the power converter 21 includes a multi-cell rectifier 22 and a step-up chopper 23.

The multi-cell rectifier 22 includes first and second input terminals IN1 and IN2, a plurality of AC-DC converters 24, and first and second output terminals OUT1 and OUT2.

The AC input voltage Vin is applied to the first and second input terminals IN1 and IN2. The plurality of AC-DC converters 24 are connected in series between the first and second input terminals IN1 and IN2. The AC-DC converters 24 each convert the divided input voltage, which is obtained by dividing the AC input voltage Vin, into the full-wave rectified voltage in an electrically insulating manner. The full-wave rectified voltage converted by the plurality of AC-DC converters 24 is output from the first and second output terminals OUT1 and OUT2.

As described above, the plurality of AC-DC converters 24 have the input side connected in series and the output side connected in parallel.

A large AC input voltage Vin, such as a voltage exceeding 1,000 V, is applied between the first and second input terminals IN1 and IN2. The AC input voltage Vin applied between the first and second input terminals IN1 and IN2 is divided by the number of AC-DC converters 24 and applied to each AC-DC converter 24. Thus, the amplitude of the AC input voltage Vin applied to each AC-DC converter 24 can be suppressed to 100 V to several hundreds of V.

Each AC-DC converter 24 includes, for example, the power rectifier 6a, which is similar to the power rectifier in FIG. 5 that performs the full-wave rectification, and a DC-DC converter 25.

As illustrated in FIG. 8, the DC-DC converter 25 includes a primary-side circuit 26 and a secondary-side circuit 27 that are electrically insulated from each other. The primary-side circuit 26 includes capacitors C1 and C2, cascode-connected sixth and seventh transistors Q6 and Q7, an inductor L1, a primary-side winding 28a of a transformer 28, and a local controller 29 that performs switching control of the sixth and seventh transistors Q6 and Q7. The secondary-side circuit 27 includes a diode bridge circuit 30 having diodes D8 to D11, a secondary-side winding 28b of the transformer 28, and a capacitor C3. A diode D6 is connected in parallel with the drain-source of the sixth transistor Q6, and a diode D7 is connected in parallel with the drain-source of the seventh transistor Q7. Note that the internal configuration of the DC-DC converter 25 illustrated in FIG. 8 is merely an example, and various modifications can be applied.

The local controller 29 performs switching control of the sixth and seventh transistors Q6 and Q7 in the corresponding DC-DC converter 25, regardless of the on/off timing of the sixth and seventh transistors Q6 and Q7 in other DC-DC converters 25.

Thus, each DC-DC converter 25 is controlled by the corresponding local controller 29, and a master controller that totally controls the plurality of DC-DC converters 25 is not provided. This is because, if each DC-DC converter 25 controls the sixth and seventh transistors Q6 and Q7 to be turned on/off at a constant duty ratio, the operation of balancing the input voltage and the output current for each DC-DC converter 25 is automatically performed without totally controlling the plurality of DC-DC converters 25.

If the master controller is provided to totally control the DC-DC converters 25 as in the conventional technique, such operation as changing the control of each local controller 29 and accordingly changing the control of the master controller again may be carried out repeatedly, so that the control may be complicated and the operation of each DC-DC converter 25 may be unstable.

Each local controller 29 in the present embodiment performs simple control by merely switching on and off the sixth and seventh transistors Q6 and Q7 at a fixed duty ratio, and no other controls such as changing the duty ratio to let the voltage and current to follow certain instruction values are not carried out. Accordingly, the input voltage and the output current of the series-connected DC-DC converters 25 are automatically balanced and, as a result, the operation of each DC-DC converter 25 is stabilized. When the windings 28a and 28b of the transformer 28 have the same number of turns, the voltage amplitude, frequency, and phase of the full-wave rectified voltage output from each DC-DC converter 25 and applied to the capacitor C3 are identical to those of the full-wave rectified voltage applied to the capacitor C1.

The step-up chopper 23 is connected to the first and second output terminals OUT1 and OUT2 of the multi-cell rectifier 22 and performs an operation of converting a DC voltage level. The step-up chopper 23 includes an inductor L2, an eighth transistor Q8, a diode D12, an electrolytic capacitor C4, a phase detector 31, a first coefficient adjuster 32, a differentiator 33, and a second coefficient adjuster 34, and a drive signal generator 35. A diode D13 is connected in parallel with the drain-source of the eighth transistor Q8.

The step-up chopper 23 detects the phase of the input voltage by the phase detector 31, and detects the zero point of the input voltage. The first coefficient adjuster 32 generates a rectified waveform indicating how much electric current to be passed with respect to the zero point. A difference between the rectified waveform and the electric current that actually passes is detected by the differentiator 33, and the second coefficient adjuster 34 performs proportional-integral control. Note that the internal configuration of the step-up chopper 23 illustrated in FIG. 8 is merely an example, and various modifications can be applied.

Figure 9:
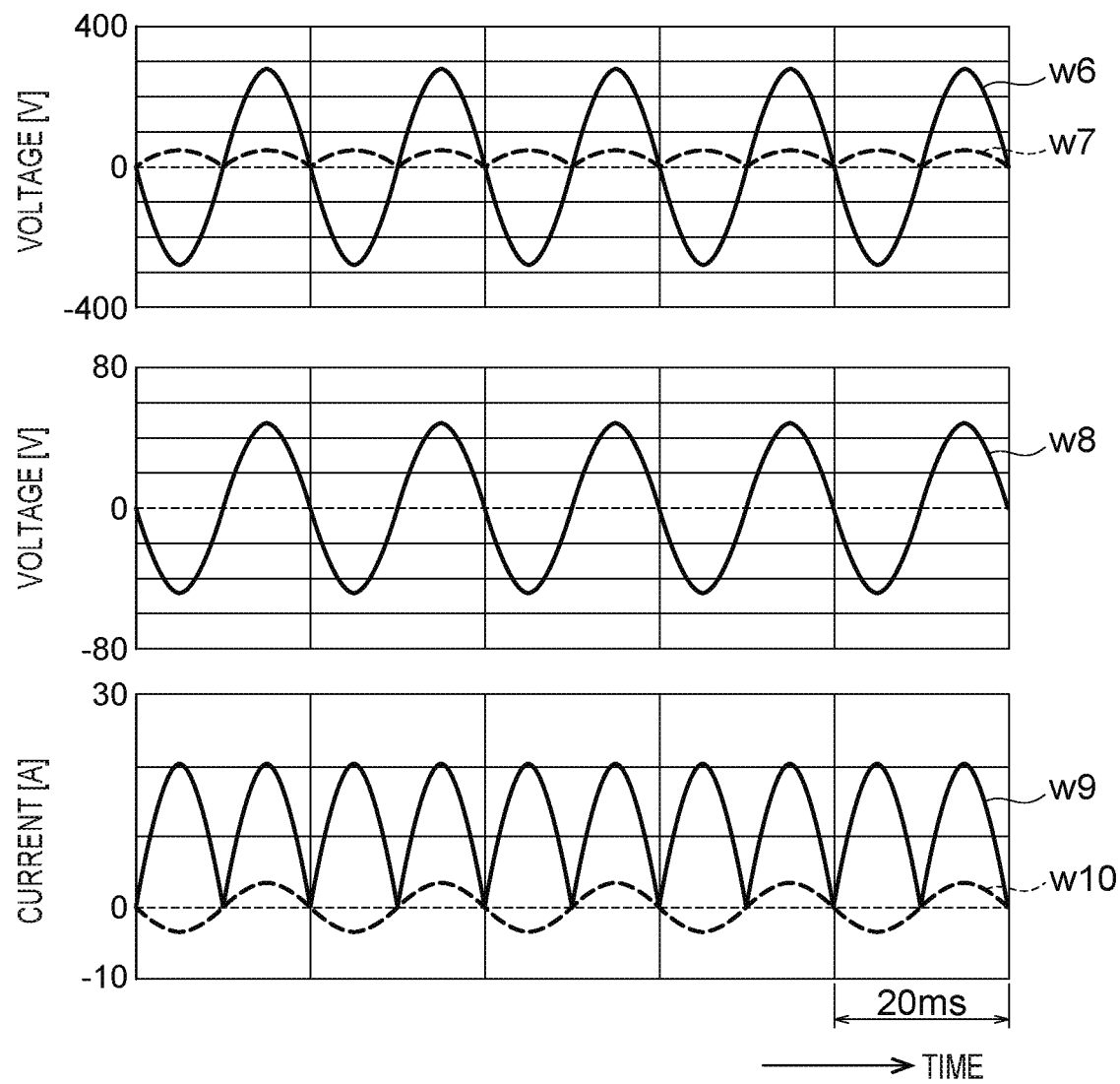
FIG. 9 is a waveform diagram of each part in the power converter of FIG. 7.

FIG. 9 is a waveform diagram of each part of the power converter 21 of FIG. 7. In FIG. 9, a waveform w6 is the waveform of the AC input voltage Vin applied to the first and second input terminals IN1 and IN2. A waveform w7 is a waveform of the voltage output from the first and second output terminals OUT1 and OUT2 in FIG. 7. A waveform w8 is a waveform of the input voltage of each AC-DC converter 24. A waveform w9 is a current waveform passing through the first output terminal OUT1. The waveform w10 is a waveform of the electric current passing through the first input terminal IN1.

As illustrated in FIG. 9, the power converter 21 of FIG. 7 operates stably even when the local controller 29 only performs control.

As described above, the power converter 21 according to the fourth embodiment includes the plurality of AC-DC converters 24 whose connection stages can be freely changed. By increasing the number of connection stages, power conversion of a large AC input voltage Vin exceeding 1,000 V can be stably performed with a simple circuit configuration. Further, each AC-DC converter 24 includes the power rectifier 6a having the power switcher 1 illustrated in, for example, FIG. 1, and the DC-DC converter 25. Since the power switcher 1 in the power rectifier 6a is configured, as in FIG. 1, by cascode-connection of the first transistor Q1 having the low withstand voltage and the second transistor Q2 having the high withstand voltage, the voltage equal to or lower than the withstand voltage can be applied to the drain-source of the first transistor Q1 and the remaining voltage can be applied to the drain-source of the second transistor Q2, so that the AC input voltage Vin exceeding 100 V can be rectified without destroying the first transistor Q1. Further, each DC-DC converter 25 is controlled by the corresponding local controller 29, and the master controller that totally controls the plurality of DC-DC converters 25 is not required, so that the control of the AC-DC converter 24 can be simplified and the circuit size can be reduced.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A power switcher, comprising:
   a first normally-off transistor including a first electrode, second electrode and a first control electrode, the first normally-off transistor switching between interrupting and not interrupting a current path between first and second electrodes according to a drive voltage input to the first control electrode;
   a second normally-on transistor cascode-connected to the first normally-off transistor and including a second control electrode to which the second electrode of the first normally-off transistor is connected;
   a control voltage generator that generates a control voltage in accordance with a voltage between the first and second electrodes of the first normally-off transistor; and
   a drive voltage generator that generates the drive voltage equal to or lower than a withstand voltage of the first normally-off transistor in accordance with the control voltage,
   wherein the second control electrode is applied with a voltage between the first electrode and the second electrode of the first normally-off transistor, and
   the first electrode is a drain, and the second electrode is a source.

2. The power switcher according to claim 1, further comprising:
   a first rectifying element connected between the first and second electrodes of the first normally-off transistor; and
   a second rectifying element connected between a third electrode and a fourth electrode of the second normally-on transistor, wherein
   a gate voltage of the first normally-off transistor and a gate voltage of the second normally-on transistor are set in a manner that, when the first normally-off transistor is turned on, an electric current passes from the second electrode to the first electrode through the first normally-off transistor, and an electric current passes from the fourth electrode to the third electrode through the second normally-on transistor.

3. The power switcher according to claim 1, further comprising:
   a polarity determination controller that determines whether to instruct the drive voltage generator to generate the drive voltage to turn on the first normally-off transistor in accordance with a polarity of the voltage between the first and second electrodes of the first normally-off transistor, wherein
   the drive voltage generator applies the drive voltage to the first control electrode when the polarity determination controller gives an instruction to generate the drive voltage.

4. The power switcher according to claim 1, wherein a withstand voltage of the second normally-on transistor is higher than the withstand voltage of the first normally-off transistor.

5. The power switcher according to claim 1, further comprising:
   a third normally-on transistor cascode-connected to the second normally-on transistor; and
   a third rectifying element connected between a third control electrode of a third transistor and the second control electrode of the second normally-on transistor.

6. The power switcher according to claim 5, wherein a withstand voltage of the third transistor is higher than the withstand voltage of the first normally-off transistor.

7. The power switcher according to claim 5, wherein the third transistor comprises n (n is an integer of 2 or more) cascode-connected transistors, and a withstand voltage of the third transistor is adjusted according to a value n and a sum of withstand voltages of the cascode-connected transistors.

8. A power rectifier, comprising:
   first and second input terminals to which an AC input voltage is applied;
   first and second output terminals from which a rectified voltage is output; and
   a first power switcher connected between the first or second input terminal and the first or second output terminal, wherein the first power switcher comprises
   a first normally-off transistor including a first electrode, second electrode and a first control electrode, the first normally-off transistor switching between interrupting and not interrupting a current path between first and second electrodes according to a drive voltage input to the first control electrode,
   a second normally-on transistor cascode-connected to the first normally-off transistor and including a second control electrode to which the second electrode of the first normally-off transistor is connected,
   a control voltage generator that generates a control voltage in accordance with a voltage between the first and second electrodes of the first normally-off transistor, and a drive voltage generator that generates the drive voltage equal to or lower than a withstand voltage of the first normally-off transistor in accordance with the control voltage, wherein the second electrode is connected to the first or second input terminal, a third electrode of the second normally-on transistor is connected to the first or second output terminal, the second control electrode is applied with a voltage between the first electrode and the second electrode of the first normally-off transistor, and the first electrode is a drain, and the second electrode is a source.

9. The power rectifier according to claim 8, wherein the third electrode outputs a half-wave rectified voltage.

10. The power rectifier according to claim 8, further comprising:

second, third, and fourth power switchers each having the first normally-off transistor, the second normally-on transistor, the control voltage generator, and the drive voltage generator, wherein the first power switcher switches between passing and not passing an electric current from the first input terminal to the first output terminal, the second power switcher switches between passing and not passing the electric current from the second output terminal to the second input terminal, the third power switcher switches between passing and not passing the electric current from the second input terminal to the first output terminal, the fourth power switcher switches between passing and not passing the electric current from the second output terminal to the first input terminal, and the first output terminal outputs a full-wave rectified voltage.

11. The power rectifier according to claim 8, further comprising:

a first rectifying element connected between the first and second electrodes of the first normally-off transistor; and a second rectifying element connected between third and fourth electrodes of the second normally-on transistor, wherein a gate voltage of the first normally-off transistor and a gate voltage of the second normally-on transistors are set in a manner that, when the first normally-off transistor is turned on, an electric current passes from the second electrode to the first electrode through the first normally-off transistor, and the electric current passes from the fourth electrode to the third electrode through the second normally-on transistor.

12. The power rectifier according to claim 8, further comprising:

a polarity determination controller that determines whether to instruct the drive voltage generator to generate the drive voltage to turn on the first normally-off transistor in accordance with the polarity of the voltage between the first and second electrodes of the first normally-off transistor, wherein the drive voltage generator applies the drive voltage to the first control electrode when the polarity determination controller gives an instruction to generate the drive voltage.

13. The power rectifier according to claim 8, wherein a withstand voltage of the second normally-on transistor is higher than the withstand voltage of the first normally-off transistor.

14. The power rectifier according to claim 8, further comprising:

a third normally-on transistor cascode-connected to the second normally-on transistor; and a third rectifying element connected between a third control electrode of a third transistor and the second control electrode of the second normally-on transistor.

15. The power rectifier according to claim 14, wherein a withstand voltage of the third transistor is higher than the withstand voltage of the first normally-off transistor.

16. The power rectifier according to claim 14, wherein the third transistor comprises n (n is an integer of 2 or more) cascode-connected transistors, and a withstand voltage of the third transistor is adjusted according to a value n and a sum of withstand voltages of the cascode-connected transistors.

17. A power converter, comprising:

first and second input terminals to which an AC input voltage is applied;

a plurality of AC-DC converters connected in series between the first and second input terminals and each converting a divided input voltage, which is obtained by dividing the AC input voltage, to a full-wave rectified voltage in an electrically isolated state; and first and second output terminals from which the full-wave rectified voltage converted by the plurality of AC-DC converters is output, wherein the AC-DC converters each comprise a power rectifier that rectifies the divided input voltage, and a DC-DC converter that converts a voltage level of an output voltage of the power rectifier, the power rectifier comprises a first power switcher, the first power switcher comprises a first normally-off transistor including a first electrode, a second electrode and the first control electrode, the first normally-off transistor switching between interrupting and not interrupting a current path between the first and second electrodes according to a drive voltage input to the first control electrode, a second normally-on transistor cascode-connected to the first normally-off transistor and including a second control electrode to which the second electrode of the first normally-off transistor is connected, a control voltage generator that generates a control voltage in accordance with a voltage between the first and second electrodes of the first normally-off transistor, and a drive voltage generator that generates the drive voltage having a withstand voltage equal to or lower than the withstand voltage of the first normally-off transistor in accordance with the control voltage, the divided input voltage is input to the second electrode, a voltage output from a third electrode of the second normally-on transistor is input to the DC-DC converter, the second control electrode is applied with a voltage between the first electrode and the second electrode of the first normally-off transistor, and the first electrode is a drain, and the second electrode is a source.

18. The power converter according to claim 17, wherein the AC-DC converter each comprise third and fourth input terminals to which the divided input voltage is applied, third and fourth output terminals from which a rectified voltage is output, and second, third, and fourth power switchers each including the first normally-off transistor, the second normally-on transistor, the control voltage generator, and the drive voltage generator, the first power switcher switches between passing or not passing an electric current from the third input terminal to the third output terminal, the second power switcher switches between passing and not passing the electric current from the fourth output terminal to the fourth input terminal, the third power switcher switches between passing and not passing the electric current from the fourth input terminal to the third output terminal, the fourth power switcher switches between passing and not passing the electric current from the fourth output terminal to the third input terminal, and the third electrode outputs a full-wave rectified voltage.

19. The power converter according to claim 17, wherein the DC-DC converters each comprise
   a plurality of switching elements cascode-connected between first and second nodes to which the output voltage of the power rectifier is applied, and
   a local controller that turns on or off the plurality of switching elements at a predetermined duty ratio.

20. The power converter according to claim 19, wherein the local controller turns on or off the plurality of switching elements at the predetermined duty ratio independently of operations of other DC-DC converters.

* * * * *

UNITED STATES PATENT AND TRADEMARK OFFICE
CERTIFICATE OF CORRECTION

PATENT NO. : 11,451,161 B2
APPLICATION NO. : 17/013981
DATED : September 20, 2022
INVENTOR(S) : Yasuke Hayashi et al.

It is certified that error appears in the above-identified patent and that said Letters Patent is hereby corrected as shown below:

In the Claims

Claim 18, Column 12, Line 63, "converter each" should read as --converters each--.

Signed and Sealed this
Ninth Day of May, 2023

Katherine Kelly Vidal
*Director of the United States Patent and Trademark Office*